United States Patent [19]
McClure

[11] Patent Number: 5,485,430
[45] Date of Patent: Jan. 16, 1996

[54] MULTIPLE CLOCKED DYNAMIC SENSE AMPLIFIER

[75] Inventor: David C. McClure, Carrollton, Tex.

[73] Assignee: SGS-Thomson Microelectronics, Inc., Carrollton, Tex.

[21] Appl. No.: 306,527

[22] Filed: Sep. 15, 1994

Related U.S. Application Data

[63] Continuation of Ser. No. 995,580, Dec. 22, 1992, abandoned.

[51] Int. Cl.⁶ .................................. G11C 8/00; G11C 7/00
[52] U.S. Cl. .......................... 365/233; 365/196; 365/203; 327/51
[58] Field of Search ..................................... 365/233, 190, 365/207, 189.05, 203, 196, 208; 307/530; 327/51

[56] References Cited

U.S. PATENT DOCUMENTS

| | | | |
|---|---|---|---|
| 4,573,147 | 2/1986 | Aoyama et al. | 365/190 |
| 4,636,987 | 1/1987 | Norwood et al. | 365/205 |
| 4,926,387 | 5/1990 | Madland | 365/203 |
| 4,970,693 | 11/1990 | Nozaki et al. | 365/233 |
| 5,036,231 | 7/1991 | Kanbara | 307/530 |
| 5,077,693 | 12/1991 | Hardee et al. | 365/233 |
| 5,083,296 | 1/1992 | Hara et al. | 365/233 |
| 5,151,879 | 9/1992 | Hsueh et al. | 365/190 |
| 5,155,397 | 10/1992 | Fassino et al. | 307/530 |
| 5,241,503 | 8/1993 | Cheng | 365/190 |
| 5,289,415 | 2/1994 | DiMarco | 365/208 |
| 5,297,090 | 3/1994 | McClure | 365/203 |
| 5,297,092 | 3/1994 | Johnson | 365/190 |

Primary Examiner—William L. Sikes
Assistant Examiner—Tiep H. Nguyen
Attorney, Agent, or Firm—Kenneth C. Hill; Lisa K. Jorgenson; Richard K. Robinson

[57] ABSTRACT

A method and circuit is provided for reading a memory array which utilizes multiple clocking signals during one read cycle to enable a dynamic sense amplifier to read data from the memory array. A dynamic sense amplifier is connected to an input line, a complementary input line, and a latch. A first equilibrating signal is input into the sense amplifier, followed thereafter by a first clocking signal. The first clocking signal enables the sense amplifier to read data on the input line and complementary input line. While the sense amplifier reads the data, the sense amplifier is isolated from the input and complementary input lines. Based upon the data read by the sense amplifier, an output state is provided for the latch. After reading the data, the sense amplifier is reconnected to the input and complementary input lines. A second clocking signal then enables the sense amplifier to read the data on the input and complementary input lines a second time, and the sense amplifier is isolated from the input and complementary input lines. The output state of the latch may or may not change based upon the data read by the sense amplifier the second time.

12 Claims, 1 Drawing Sheet

MULTIPLE CLOCKED DYNAMIC SENSE AMPLIFIER

This is a continuation of application Ser. No. 07/995,580, filed Dec. 22, 1992 and now abandoned.

BACKGROUND OF THE INVENTION

1. Field of the Invention

The present invention relates in general to integrated circuits, and more particularly to memory arrays. Still more particularly, the present invention relates to dynamic sense amplifiers for memory arrays.

2. Description of the Prior Art

Sense amplifiers are used to read the voltage levels in a static random access memory (SRAM) and dynamic random access memory (DRAM) devices. Two types of sense amplifiers may be used to read the memory arrays, a static sense amplifier and a dynamic sense amplifier. Dynamic sense amplifiers offer various advantages over static sense amplifiers, examples being lower power consumption, more compact layout, and higher sensing speed.

A disadvantage to using typical dynamic sense amplifiers is the inability to "recover" the output of the sense amplifier. To "recover" a sense amplifier means to change the output of the sense amplifier if the initial data sensed was incorrect. If only one memory cell out of the SRAM memory array is read incorrectly and can not be recovered, the die is useless.

To reduce the chances of having a dynamic sense amplifier read a cell incorrectly, the dynamic sense amplifiers are not enabled, or "clocked", at an optimum time, but rather are clocked after a worst case time delay. A worst case time delay typically takes into account processing, sense amplifier offsets, and operating conditions such as temperature and voltage. Clocking a dynamic sense amplifier after a worst case time delay ensures that a sufficient signal has built up before sensing begins. Clocking the sense amplifier in this manner, however, has the undesirable effect of reducing the operation speed of some of the potentially faster SRAMs in the distribution of memory arrays in order to ensure the slower SRAMs within the distribution of memory arrays are fully functional.

Therefore, it would be desirable to provide a method and circuit for reading a memory array which can be recovered and which may operate at a faster rate of speed.

SUMMARY OF THE INVENTION

A method and circuit is provided for reading a memory array which utilizes multiple clocking signals during one read cycle to enable a dynamic sense amplifier to read data from the memory array. A dynamic sense amplifier is connected to an input line, a complementary input line, and a latch. A first equilibrating signal is input into the sense amplifier, followed thereafter by a first clocking signal. The first clocking signal enables the sense amplifier to read data on the input line and complementary input line. While the sense amplifier reads the data, the sense amplifier is isolated from the input and complementary input lines. Based upon the data read by the sense amplifier, an output state is provided for the latch. After reading the data, the sense amplifier is reconnected to the input and complementary input lines. A second clocking signal then enables the sense amplifier to read the data on the input and complementary input lines a second time, and the sense amplifier is isolated from the input and complementary input lines. The output state of the latch may or may not change based upon the data read by the sense amplifier the second time.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
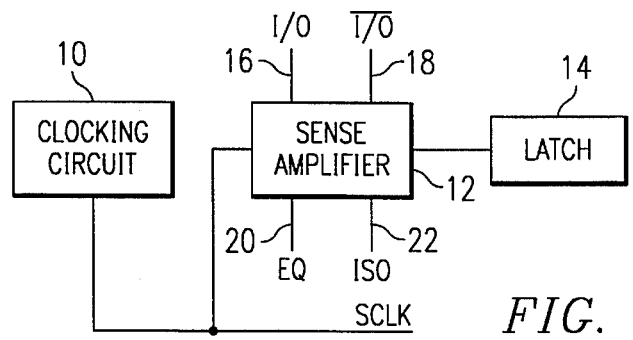
FIG. 1 is a high level block diagram illustrating a circuit according to the present invention.

Referring to FIG. 1, a high level block diagram illustrates a circuit according to the present invention. A clocking circuit 10 is connected to a dynamic sense amplifier 12, and a latch 14 is connected to dynamic sense amplifier 12. Any clocking circuit which can generate multiple clocking signals may be utilized as clocking circuit 10.

Signal lines 16, 18 labeled I/O and I/O bar, respectively, are connected to sense amplifier 12. I/O and I/O bar may be connected to sense amplifier 12 from a memory array (not shown) directly, in which case I/O corresponds to a BIT line, and I/O bar corresponds to a BIT line bar. Alternatively, I/O and I/O bar may connect to the memory array indirectly, one example being through a bus. Either way, I/O and I/O bar are complements of each other.

During one read cycle of the memory array, defined as the period between two consecutive memory array equilibrate signals, an equilibrating signal (EQ) is activated, or driven low on signal line 20. As known in the art, equilibrating signal (EQ) may be a separate equilibrating signal from the one utilized to equilibrate the memory array. Clocking circuit 10 then generates a first clocking signal (SCLK) which enables sense amplifier 12 to read the data on I/O and I/O bar. Based upon the data read, an output state is provided for latch 14. The equilibrating signal (EQ) is then driven low on signal line 20 a second time.

During the time between the first clocking signal and the second equilibrating signal, sense amplifier 12 is isolated from I/O and I/O bar as the result of an isolating signal (ISO) on signal line 22. After the second equilibrating signal is input into sense amplifier 12, ISO is deactivated and sense amplifier 12 is reconnected to I/O and I/O bar. Clocking circuit 10 then generates a second clocking signal which enables sense amplifier 12 to read the data on I/O and I/O bar a second time. If the data read is different from the data read after the first clocking signal, the state of latch 14 changes. If the data read is the same as the data read after the first clocking signal, the state of latch 14 remains unchanged.

Figure 2:
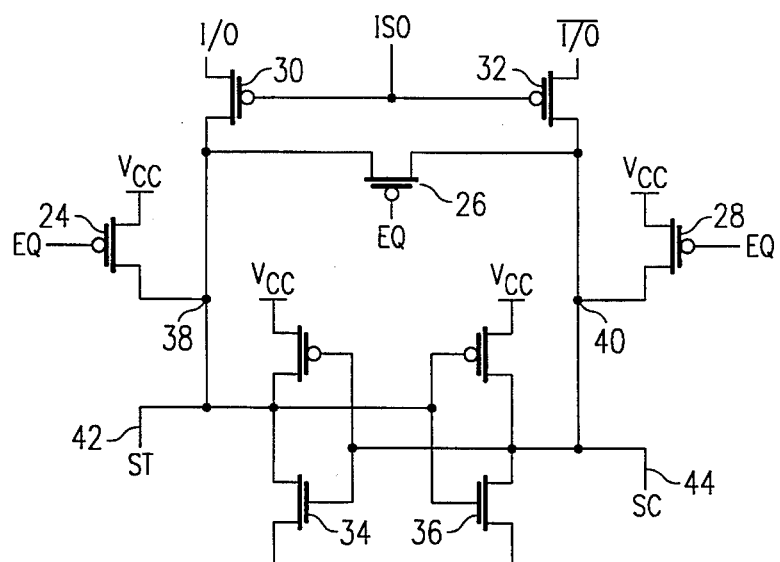
FIG. 2 depicts a detailed circuit diagram of a dynamic sense amplifier according to the present invention.

FIG. 2 depicts a detailed circuit diagram of a dynamic sense amplifier according to the present invention. Equilibrating signal (EQ) is an input into p-channel transistors 24, 26, 28. I/O and isolating (ISO) signal are connected to p-channel transistor 30, with I/O bar and ISO connected to p-channel transistor 32. Finally, the clocking signal (SCLK) is connected to transistors 34, 36.

To equilibrate the sense amplifier, EQ signal is set low to turn on transistors 24, 26, 28. This sets nodes 38, 40 to a common voltage level, which in the preferred embodiment is Vcc. Although the preferred embodiment utilizes transistors 24, 26, 28 to equilibrate the sense amplifier, this step can also be performed with transistor 26 alone, or with transistors 24, 28. Transistor 26 may be used by itself since it shorts the input and complementary input lines together, which causes nodes 38, 40 to be set to a common voltage. Transistors 24, 28 may be used together to equilibrate the sense amplifier because they short the input and complementary input lines to the voltage level connected to the transistors. In the preferred embodiment, the voltage level is $V_{cc}$.

Referring again to FIG. 2, EQ signal then goes high to turn off transistors 24, 26, 28. To read the data on I/O and I/O bar, isolating signal (ISO) is set low, which turns on transistors 30, 32, and the voltage level at either node 38 or 40 begins to drop as the corresponding I/O line discharges. Nodes 38, 40 begin to charge up or down to a voltage level which reflects the voltage level on I/O and I/O bar, respectively.

When the clocking signal (SCLK) is set low to enable the sense amplifier to read the data on I/O and I/O bar, ISO is set high. Setting ISO high turns off transistors 30, 32, to isolate the circuit from I/O and I/O bar. I/O and I/O bar have very high capacitance. Thus, isolating the sense amplifier from I/O and I/O bar enables the sense amplifier to read the data on I/O and I/O bar faster, since the high capacitive load of I/O and I/O bar has been removed. Isolating the sense amplifier from I/O and I/O bar also protects the signal on I/O and I/O bar from being disrupted when the sense amplifier is clocked. Finally, signal lines 42, 44 labeled ST and SC, respectively, are connected to a latch, and the state of the latch depends upon the data read from I/O and I/O bar.

Figure 3:
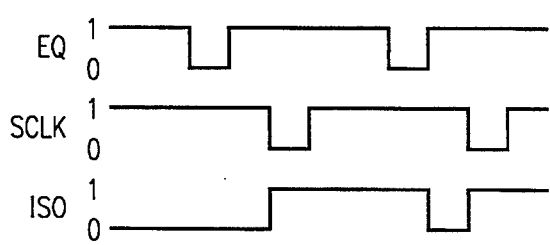
FIG. 3 illustrates a timing diagram for the dynamic sense amplifier of FIG. 2.

Referring to FIG. 3, a timing diagram for the dynamic sense amplifier of FIG. 2 is illustrated. Initially, the voltage levels of the equilibrating signal (EQ) and the clocking signal (SCLK) are set high, and the isolating signal (ISO) is set low. The sense amplifier is first equilibrated, which is depicted by the EQ signal going low for a period of time. It will be clearly appreciated by those skilled in the art that equilibrating the sense amplifier while the isolation transistors 30 and 32 are on also equilibrates the lines I/O and I/O bar. SCLK is then clocked low and ISO goes high for a period of time, which allows the sense amplifier to read the data on I/O and I/O bar. In the preferred embodiment, ISO transitions closely with SCLK in order to avoid disrupting the signals on the I/O and I/O bar lines.

The sense amplifier is then equilibrated a second time while ISO is high. This resets the sense amplifier without affecting the I/O and I/O bar lines. After the second equilibrating signal, ISO goes low, which allows the data on I/O and I/O bar to be input into the sense amplifier. The sense amplifier is then isolated and clocked again, allowing the sense amplifier to read the data on I/O and I/O bar a second time.

Alternatively, the method may be modified to avoid the use of the second equilibrating signal. After the first clocking signal has enabled the sense amplifier and has gone back to a high voltage level, ISO can be set low. This causes nodes 38, 40 to ultimately be set to the voltage level on I/O and I/O bar, respectively, due to charge sharing between the input and complementary input lines and the sense amplifier. The sense amplifier is reconnected to the input and complementary input lines by having ISO go low, and the second clocking signal can now be utilized to enable the sense amplifier to read the data on the input and complementary input lines.

Although the preferred embodiment utilizes two clocking signals, it is possible to use more than two clocking signals during one read cycle of the memory array. The number of clocking signals may be tailored to the specific needs of the application.

Figure 4:
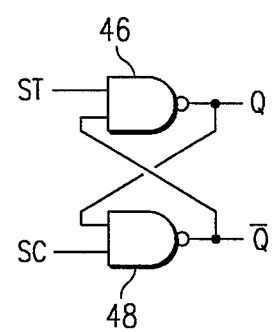
FIG. 4 depicts a detailed circuit diagram of a latch which may be utilized with the present invention.

FIG. 4 depicts a detailed circuit diagram of a latch which may be utilized with the present invention. Two input NAND gates 46, 48 are cross-coupled, with ST as an input into NAND gate 46 and SC as an input into NAND gate 48. Typically, both ST and SC are initially set to 1. The state of the latch is unaffected when ST and SC are both 1. When a clocking signal enables the sense amplifier to read the input and complementary input lines, either ST or SC will go low. If ST is high, or 1, and SC is low, or 0, then Q=0 and Q bar=1. Alternatively, if ST is a 0 and SC is a 1, then Q=1 and Q bar=0.

One of the benefits of using dynamic sense amplifiers to read memory arrays is that dynamic sense amplifiers require much less current to operate in comparison to static sense amplifiers. One advantage to the present invention is the ability to recover the output of the dynamic sense amplifier by generating multiple clocking signals during one read cycle of a memory array. Furthermore, the present invention allows for faster clocking of a dynamic sense amplifier. The first clocking signal may be timed at an aggressive clocking speed, and a portion of the distribution of the memory arrays can correctly sense data at this rate. The second clocking signal may be timed at a more passive clocking speed. The remaining memory arrays in the distribution will operate at the slower clocking rate, thereby allowing the entire distribution of memory arrays to be functional.

While the invention has been particularly shown and described with reference to a preferred embodiment, it will be understood by those skilled in the art that various changes in form and detail may be made therein without departing from the spirit and scope of the invention.

What is claimed is:

1. A circuit for use with a memory array, comprising:
   a sense amplifier connected to an input line and a complementary input line, wherein the sense amplifier senses data on the input line and complementary input line only during a clock pulse applied to a sense amplifier clock input;
   a clocking circuit connected to the sense amplifier clock input, utilized to enable said sense amplifier to read data on the input line and complementary input line by generating clock pulses, wherein said clocking circuit generates, during a single read cycle of the memory array, a first clock pulse followed after a predetermined time period by a second clock pulse, wherein the single read cycle of the memory array is the period between two consecutive equilibrations of the input line and the complementary input line; and
   a latch connected to the sense amplifier, wherein the latch stores data sensed by the sense amplifier during the first and second clock pulses.

2. The circuit of claim 1, wherein the output state of the latch is determined by the sense amplifier reading the data on the input and complementary input lines as a result of the first clock pulse.

3. The circuit of claim 1, wherein the output state of the latch is determined by the sense amplifier reading the data on the input and complementary input lines as a result of the second clock pulse.

4. The circuit of claim 1, wherein the sense amplifier is isolated from the input and complementary input lines at least once during the single read cycle of the memory array.

5. The circuit of claim 1, wherein the input line is a bit line in the memory array, and the complementary input line is a complementary bit line in the memory array.

6. A method for reading data from a memory array, comprising the steps of:

applying a first equilibrating signal to a sense amplifier in preparation for a single read cycle of the memory array, wherein the sense amplifier is connected to the input line and the complementary input line;

initially equilibrating an input line and a complementary input line;

applying a first clocking signal to the sense amplifier to enable the sense amplifier to read the data on the input line and complementary input line;

isolating the sense amplifier from the input line and complementary input line when applying the first clocking signal;

reading the data on the input and complementary input lines a first time;

providing an output to a latch connected to the sense amplifier as a result of reading the data on the input line and complementary input line;

reconnecting the sense amplifier to the input and complementary input lines before applying a second clocking signal to the sense amplifier;

applying the second clocking signal to the sense amplifier to enable the sense amplifier to read the data on the input line and complementary input line a second time;

reading the data on the input line and complementary input line a second time; and subsequently equilibrating the input line and the complementary input line, wherein the input and complementary input lines are not equilibrated between the initial equilibrating step and the subsequent equilibrating step.

7. The method of claim 6, further comprising the step of applying a second equilibrating signal to the sense amplifier before the step of reconnecting the sense amplifier to the input and complementary input lines occurs.

8. The method of claim 7, further comprising the step of isolating the sense amplifier from the input and complementary input lines when applying the second equilibrating signal to the sense amplifier.

9. The method of claim 7, further comprising the step of isolating the sense amplifier from the input and complementary input lines when applying the second clocking signal to the sense amplifier.

10. The method of claim 6, further comprising the step of isolating the sense amplifier from the input line and complementary input line when applying the second clocking signal to the sense amplifier.

11. The method of claim 6, further comprising the step of providing an output state to the latch as a result of reading the data on the input line and complementary input line a second time.

12. The method of claim 6, wherein said step of reading the data on the input and complementary input lines comprises reading the data on a BIT line and corresponding complementary BIT line in the memory array.

* * * * *